(12) United States Patent
Matsumoto et al.

(10) Patent No.: US 11,094,500 B2
(45) Date of Patent: Aug. 17, 2021

(54) DISCHARGE CONTROL APPARATUS AND METHOD

(71) Applicant: NGK SPARK PLUG CO., LTD., Nagoya (JP)

(72) Inventors: Yuji Matsumoto, Nagoya (JP); Kazunari Kokubo, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 16/828,450

(22) Filed: Mar. 24, 2020

(65) Prior Publication Data

US 2020/0312607 A1    Oct. 1, 2020

(30) Foreign Application Priority Data

Mar. 29, 2019 (JP) .............................. JP2019-067882

(51) Int. Cl.
  *H01J 37/24* (2006.01)
  *H02M 3/335* (2006.01)
(52) U.S. Cl.
  CPC ......... *H01J 37/241* (2013.01); *H02M 3/3353* (2013.01); *H02M 3/33507* (2013.01)
(58) Field of Classification Search
  CPC ............. H01J 37/241; H02M 3/33507; H02M 3/3353; H02M 2001/0009; H02M 3/33584; H02M 3/33523; H02J 50/10; H02J 50/80; H02J 7/0068
  See application file for complete search history.

(56) References Cited

U.S. PATENT DOCUMENTS

| 6,287,980 | B1 * | 9/2001 | Hanazaki | ............ | H01J 37/3244 156/345.28 |
| 6,539,930 | B2 * | 4/2003 | Inagaki | ................... | F02P 3/051 123/655 |
| 8,912,781 | B2 * | 12/2014 | Singh | ................... | H05B 45/375 323/285 |
| 2005/0024898 | A1 * | 2/2005 | Yang | ................. | H02M 3/33507 363/21.12 |

(Continued)

FOREIGN PATENT DOCUMENTS

| JP | 2017-016858 A |   | 1/2017 |
| JP | 2017118750 A | * | 6/2017 |
| JP | 2018019562 A | * | 2/2018 |

*Primary Examiner* — Borna Alaeddini
(74) *Attorney, Agent, or Firm* — Sughrue Mion, PLLC (57) ABSTRACT

A discharge control apparatus for controlling a flyback power supply circuit which includes a transformer having a primary coil and a secondary coil and performing voltage conversion, and a driver for controlling energization of the primary coil. The power supply circuit supplies electric energy to a plasma reactor. The discharge control apparatus calculates, based on primary current flowing through the primary coil and primary voltage generated in the primary coil, supply energy supplied to the primary coil and regeneration energy which is a portion of the supply energy not used for the discharge in the plasma reactor. The discharge control apparatus controls the power supply circuit based on the calculated supply energy and the calculated regeneration energy. Also disclosed is a method for controlling the flyback power supply circuit.

2 Claims, 10 Drawing Sheets

(56) References Cited

U.S. PATENT DOCUMENTS

| | | | |
|---|---|---|---|
| 2005/0073862 A1* | 4/2005 | Mednik | H02M 3/33523 363/20 |
| 2006/0056204 A1* | 3/2006 | Yang | H02M 3/33507 363/10 |
| 2006/0284567 A1* | 12/2006 | Huynh | H02M 3/33507 315/246 |
| 2007/0121349 A1* | 5/2007 | Mednik | H02M 3/33523 363/21.01 |
| 2009/0237960 A1* | 9/2009 | Coulson | H02M 3/33523 363/21.12 |
| 2010/0246216 A1* | 9/2010 | Coulson | H02M 3/33523 363/21.12 |
| 2018/0215639 A1* | 8/2018 | Locke | B01J 19/1825 |

* cited by examiner

DISCHARGE CONTROL APPARATUS AND METHOD

BACKGROUND OF THE INVENTION

1. Field of the Invention

The present disclosure relates to a discharge control apparatus for controlling a power supply circuit which supplies electric energy to a plasma reactor, and to a discharge control method for controlling the power supply circuit.

2. Description of the Related Art

Patent Document 1 describes an application voltage control apparatus which detects current flowing to a plasma reactor as a result of generation of a pulse-like secondary voltage of a step-up circuit, and estimates the value of application voltage applied to the plasma reactor based on an integral current value obtained by integrating the detected current value.

[Patent Document 1] Japanese Patent Application Laid-Open (kokai) No 2017-16858

3. Problems to be Solved by the Invention

In the technique described in Patent Document 1, the current on the secondary side is directly detected and used to control the plasma reactor. Since the secondary voltage of the step-up circuit is a high voltage of several kilovolts, the current detection must be performed in a state in which insulation is secured by using, for example, a non-contact-type current sensor. Therefore, the technique described in Patent Document 1 requires a component or assembly for insulating the current sensor which may result in increased production cost and complexity of the apparatus.

SUMMARY OF THE INVENTION

It is therefore an object of the present disclosure to reduce production cost or simplify the structure of a control apparatus for controlling a flyback power supply circuit.

The above object has been achieved by providing (1) a discharge control apparatus for controlling a flyback power supply circuit. The power supply circuit comprises a transformer having a primary coil and a secondary coil and which performs voltage conversion, and a driver for controlling energization of the primary coil. The power supply circuit supplies electric energy to a plasma reactor which generates plasma by discharge.

The discharge control apparatus of the present disclosure comprises an energy calculation section and a control section.

The energy calculation section is configured to calculate, based on primary current flowing through the primary coil and primary voltage generated in the primary coil, supply energy supplied to the primary coil and regeneration energy which is a portion of the supply energy not used for the discharge in the plasma reactor.

The control section is configured to control the power supply circuit based on the supply energy and regeneration energy calculated by the energy calculation section.

The discharge control apparatus of the present disclosure configured as described above calculates the supply energy and the regeneration energy based on the primary current flowing through the primary coil and the primary voltage generated in the primary coil, and controls the power supply circuit based on the supply energy and regeneration energy. By virtue of this configuration, the discharge control apparatus of the present disclosure can control the power supply circuit without use of secondary current flowing through the secondary coil and secondary voltage generated in the secondary coil. Therefore, the discharge control apparatus of the present disclosure can eliminate the necessity of a component or assembly for securing insulation, thereby reducing production cost or simplifying apparatus configuration.

In a preferred embodiment (2) of the discharge apparatus (1) of the present disclosure, the energy calculation section calculates the supply energy in accordance with the following Equation (1) and calculates the regeneration energy in accordance with the following Equation (2). The supply energy is denoted by $E_{sup}$. The regeneration energy is denoted by $E_{reg}$. The value of the primary current is denoted by $I_p$. The value of the primary voltage is denoted by $V_p$. The time period during which the supply energy is generated is denoted a period from time $t_1$ to time $t_2$, and the time period during which the regeneration energy is generated is denoted a period from time $t_3$ to time $t_5$.

[Expression 1]

$$E_{sup} = \int_{t_1}^{t_2} V_p \cdot I_p \, dt \tag{1}$$

$$E_{reg} = \int_{t_3}^{t_5} V_p \cdot I_p \, dt \tag{2}$$

In a second aspect, the present disclosure provides (3) a discharge control method for controlling a flyback power supply circuit.

The discharge control method comprises an energy calculation step and a control step.

The energy calculation comprises calculating the supply energy supplied to the primary coil and the regeneration energy which is a portion of the supply energy not used for the discharge in the plasma reactor based on the primary current flowing through the primary coil and the primary voltage generated in the primary coil.

The control step comprises controlling the power supply circuit based on the supply energy and the regeneration energy calculated by the energy calculation step.

Since the discharge control method of the present disclosure is executed by the discharge control apparatus of the present disclosure, effects similar to those obtained by the discharge control apparatus of the present disclosure can be obtained by performing the method.

DESCRIPTION OF REFERENCE NUMERALS

Reference numerals used to identify various features in the drawings include the following.

3 . . . plasma reactor, 4 . . . transformer, 6 . . . discharge control apparatus, 21 . . . primary coil, 22 . . . secondary coil, 32 . . . driver

DETAILED DESCRIPTION OF THE PREFERRED EMBODIMENTS

An embodiment of the present disclosure will next be described in greater detail with reference to the drawings. However, the present disclosure should not be construed as being limited thereto.

Figure 1:
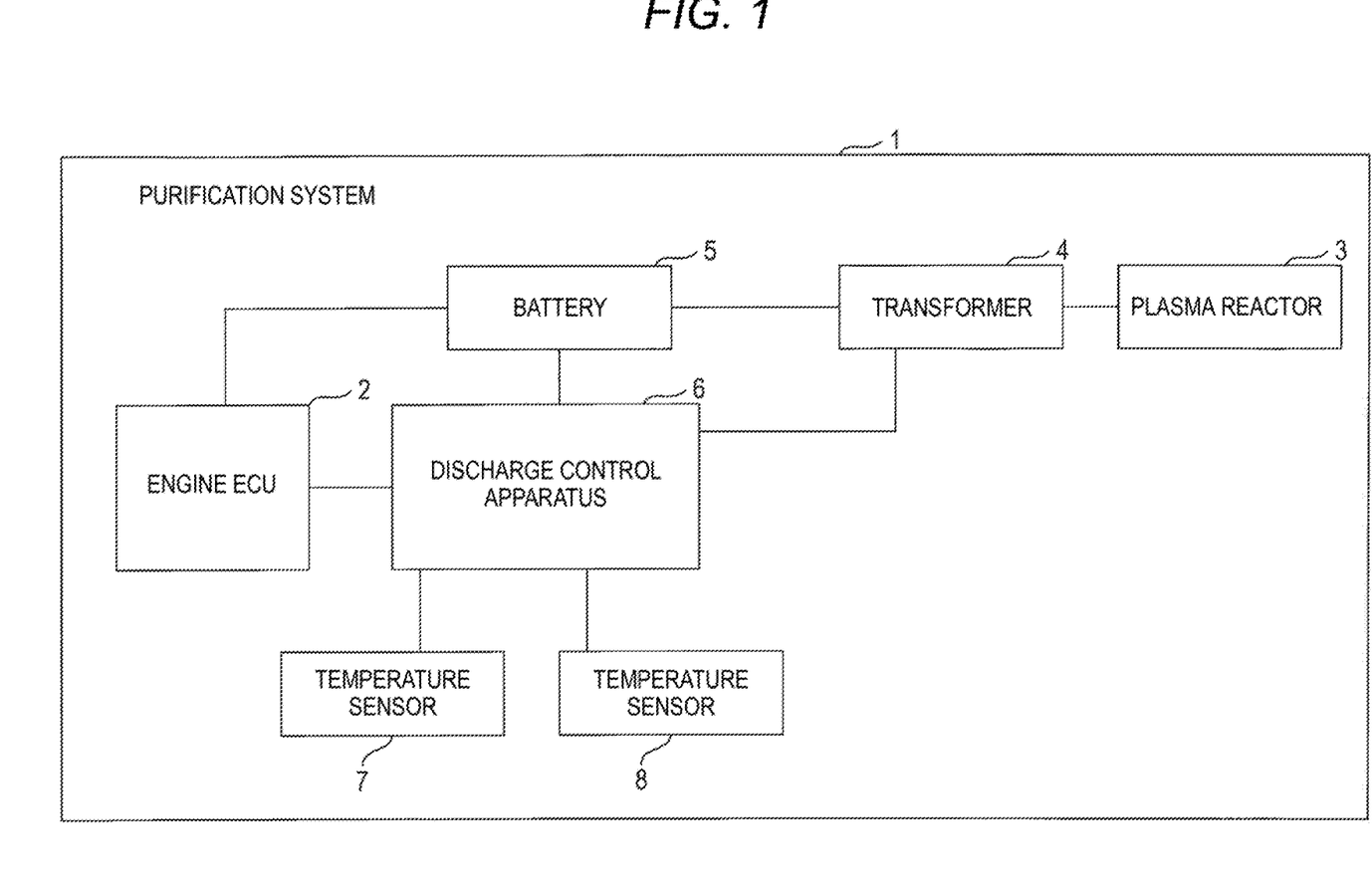
FIG. 1 is a block diagram showing the schematic configuration of a purification system.

As shown in FIG. 1, a purification system 1 of the present embodiment includes an electronic control apparatus 2, a plasma reactor 3, a transformer 4, a battery 5, a discharge control apparatus 6, and temperature sensors 7 and 8.

The electronic control apparatus 2 controls an engine of a vehicle on which the purification system 1 is mounted. In the following description, the electronic control apparatus 2 will be referred to as the engine ECU 2. ECU is an abbreviation for Electronic Control Unit.

The plasma reactor 3 generates plasma by dielectric barrier discharge. As a result, the plasma reactor 3 removes particulate matter, hydrocarbons, etc., contained in exhaust gas discharged from the engine of the vehicle.

The transformer 4 outputs a high voltage for driving the plasma reactor 3. The battery 5 supplies a power supply voltage VB to the engine ECU 2, the transformer 4, and the discharge control apparatus 6.

The discharge control apparatus 6 controls the discharge by the plasma reactor 3 through switching between an energization state in which current flows to the transformer 4 and a non-energization state in which no current flows to the transformer 4. The discharge control apparatus 6 performs data communication with the engine ECU 2 through a communication line.

The temperature sensor 7 detects the temperature of the transformer 4 and outputs to the discharge control apparatus 6 a detection signal representing the detected temperature of the transformer 4. The temperature sensor 8 detects the temperature of a driver 32 which is provided in the discharge control apparatus 6 described below. The temperature sensor 8 outputs to the discharge control apparatus 6 a detection signal representing the detected temperature of the driver 32. Notably, the driver 32 is shown in FIG. 2.

Figure 2:
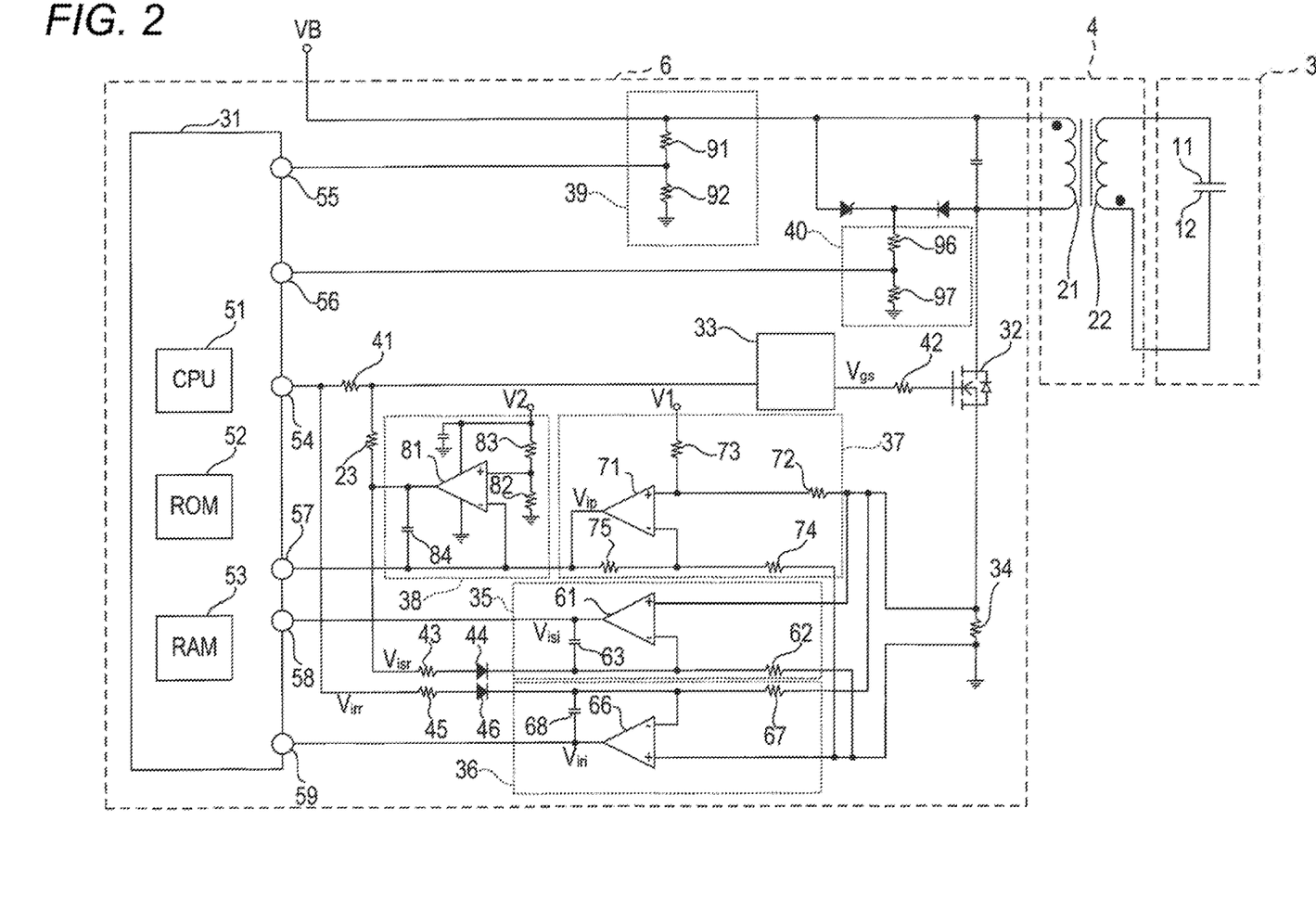
FIG. 2 is a circuit diagram showing the configurations of a plasma reactor, a transformer, and a discharge control apparatus.

As shown in FIG. 2, the plasma reactor 3 includes a plurality of first electrode panels each of which includes a discharge electrode 11 embedded therein, and a plurality of second electrode panels each of which includes a discharge electrode 12 embedded therein. The first electrode panels and the second electrode panels are disposed alternatingly along the flow direction of the exhaust gas at predetermined intervals. The plasma reactor 3 generates plasma as a result of application of voltage between the first and second electrode panels located adjacent to each other.

The transformer 4 includes a primary coil 21 and a secondary coil 22. One end of the primary coil 21 is connected to the positive terminal of the battery 5, and the other end of the primary coil 21 is connected to the discharge control apparatus 6. One end of the secondary coil 22 is connected to the discharge electrode 11 of the plasma reactor 3, and the other end of the secondary coil 22 is connected to the discharge electrode 12 of the plasma reactor 3.

When the discharge control apparatus 6 brings the transformer 4 into the above-described energization state, current flows to the primary coil 21 and energy is stored therein. Subsequently, when the discharge control apparatus 6 brings the transformer 4 into the above-described non-energization state, the supply of current to the primary coil 21 is cut off. As a result, the energy stored in the primary coil 21 is conveyed to the secondary coil 22, and high voltage is generated in the secondary coil 22. Namely, the transformer 4 generates high voltage in a flyback configuration.

The discharge control apparatus 6 includes a microcomputer 31, a driver 32, a gate driver 33, a resistor 34, current integration circuits 35 and 36, a current detection circuit 37, a regeneration detection circuit 38, and voltage detection circuits 39 and 40.

The microcomputer 31 includes a CPU 51, a ROM 52, and a RAM 53. The various functions of the microcomputer are realized by a program which is stored in a non-transitory tangible recording medium and executed by the CPU 51. In this example, the ROM 52 corresponds to the non-transitory tangible recording medium storing the program. Also, a method corresponding to the program is performed as a result of execution of this program. Notably, some or all of the functions of the CPU 51 may be realized by hardware; for example, by a single IC or a plurality of ICs. The discharge control apparatus 6 may include a single microcomputer or a plurality of microcomputers.

The microcomputer 31 has a voltage output terminal 54 and voltage input terminals 55, 56, 57, 58, and 59.

The driver 32 is an N-channel-type MOSFET. The drain of the driver 32 is connected to the primary coil 21 of the transformer 4. The source of the driver 32 is grounded through the resistor 34.

The input terminal of the gate driver 33 is connected to the voltage output terminal 54 of the microcomputer 31 through a resistor 41. The output terminal of the gate driver 33 is connected to the gate of the driver 32 through a resistor 42. The gate driver 33 receives a PWM signal output from the voltage output terminal 54 of the microcomputer 31 and outputs, in accordance with the voltage level of the PWM signal, a gate control voltage $V_{gs}$ applied to the gate of the driver 32 for switching the driver 32 between on and off states. Specifically, when the PWM signal is at a high level, the gate driver 33 switches the gate control voltage $V_{gs}$ to a high level, and when the PWM signal is at a low level, the gate driver 33 switches the gate control voltage $V_{gs}$ to a low level. PWM is an abbreviation for Pulse Width Modulation.

The driver 32 assumes an on state when the gate control voltage $V_{gs}$ applied to the gate is at a high level. As a result, current flows between the drain and the source of the driver 32. Meanwhile, the driver 32 assumes an off state when the gate control voltage $V_{gs}$ applied to the gate is at a low level. As a result, the flow of current between the drain and the source of the driver 32 stops.

One end of the resistor 34 is connected to the source of the driver 32, and the other end of the resistor 34 is grounded.

The current integration circuit 35 includes an operational amplifier 61, a resistor 62, and a capacitor 63. The non-inverting input terminal of the operational amplifier 61 is connected to the one end of the resistor 34. The inverting input terminal of the operational amplifier 61 is connected to the other end of the resistor 34 through the resistor 62. The output terminal of the operational amplifier 61 is connected to the voltage input terminal 58. One end of the capacitor 63 is connected to the output terminal of the operational amplifier 61, and the other end of the capacitor 63 is connected to the inverting input terminal of the operational amplifier 61. The current integration circuit 35 configured as described above outputs a supply current integration voltage $V_{isi}$ by integrating, with time, the voltage generated across the resistor 34 when a current flows through the resistor 34 from the driver 32 side toward the ground side.

The current integration circuit 36 includes an operational amplifier 66, a resistor 67, and a capacitor 68. The non-inverting input terminal of the operational amplifier 66 is connected to the other end of the resistor 34. The inverting input terminal of the operational amplifier 66 is connected to the one end of the resistor 34 through the resistor 67. The output terminal of the operational amplifier 66 is connected to the voltage input terminal 59. One end of the capacitor 68 is connected to the output terminal of the operational amplifier 66, and the other end of the capacitor 68 is connected to the inverting input terminal of the operational amplifier 66. The current integration circuit 36 configured as described above outputs a regeneration current integration voltage $V_{iri}$ by integrating, with time, the voltage generated across the resistor 34 when a current flows through the resistor 34 from the ground side toward the driver 32 side.

The current detection circuit 37 includes an operational amplifier 71 and resistors 72, 73, 74, and 75. The output terminal of the operational amplifier 71 is connected to the voltage input terminal 57. The resistor 72 is connected between the one end of the resistor 34 and the non-inverting input terminal of the operational amplifier 71. A voltage V1 (in the present embodiment, for example, 2.5 V) is applied to one end of the resistor 73, and the other end of the resistor 73 is connected to the non-inverting input terminal of the operational amplifier 71. The resistor 74 is connected between the other end of the resistor 34 and the inverting input terminal of the operational amplifier 71. The resistor 75 is connected, as a feedback resistor, between the inverting input terminal and the output terminal of the operational amplifier 71. Namely, a differential amplification circuit is formed by the operational amplifier 71 and the resistors 72, 73, 74, and 75. Therefore, the operational amplifier 71 outputs a voltage $V_{ip}$ by amplifying the voltage generated across the resistor 34. The regeneration detection circuit 38 includes an operational amplifier 81, resistors 82 and 83, and a capacitor 84. The inverting input terminal of the operational amplifier 81 is connected to the other end of the resistor 34 through the resistor 75 and the resistor 74. The output terminal of the operational amplifier 81 is connected to the inverting input terminal of the operational amplifier 61 through a resistor 43 and a diode 44. Further, the output terminal of the operational amplifier 81 is connected to the input terminal of the gate driver 33 through a resistor 23. Therefore, the gate driver 33 switches the gate control voltage $V_{gs}$ to a high level when the output signal from the regeneration detection circuit 38 is at a high level, and switches the gate control voltage $V_{gs}$ to a low level when the output signal from the regeneration detection circuit 38 is at a low level.

One end of the resistor 82 is connected to the non-inverting input terminal of the operational amplifier 81, and the other end of the resistor 82 is grounded. A voltage V2 (in the present embodiment, for example, 5 V) is applied to one end of the resistor 83, and the other end of the resistor 83 is connected to the non-inverting input terminal of the operational amplifier 81. One end of the capacitor 84 is connected to the output terminal of the operational amplifier 81, and the other end of the capacitor 84 is connected to the inverting input terminal of the operational amplifier 81.

The voltage detection circuit 39 includes resistors 91 and 92. One end of the resistor 91 is connected to the positive terminal of the battery 5, and the other end of the resistor 91 is connected to the voltage input terminal 55. One end of the resistor 92 is connected to the voltage input terminal 55, and the other end of the resistor 92 is grounded.

The voltage detection circuit 40 includes resistors 96 and 97. One end of the resistor 96 is connected to the other end of the primary coil 21, and the other end of the resistor 96 is connected to the voltage input terminal 56. One end of the resistor 97 is connected to the voltage input terminal 56, and the other end of the resistor 97 is grounded.

The voltage output terminal 54 is connected to the inverting input terminal of the operational amplifier 66 through a resistor 45 and a diode 46.

Figure 3:
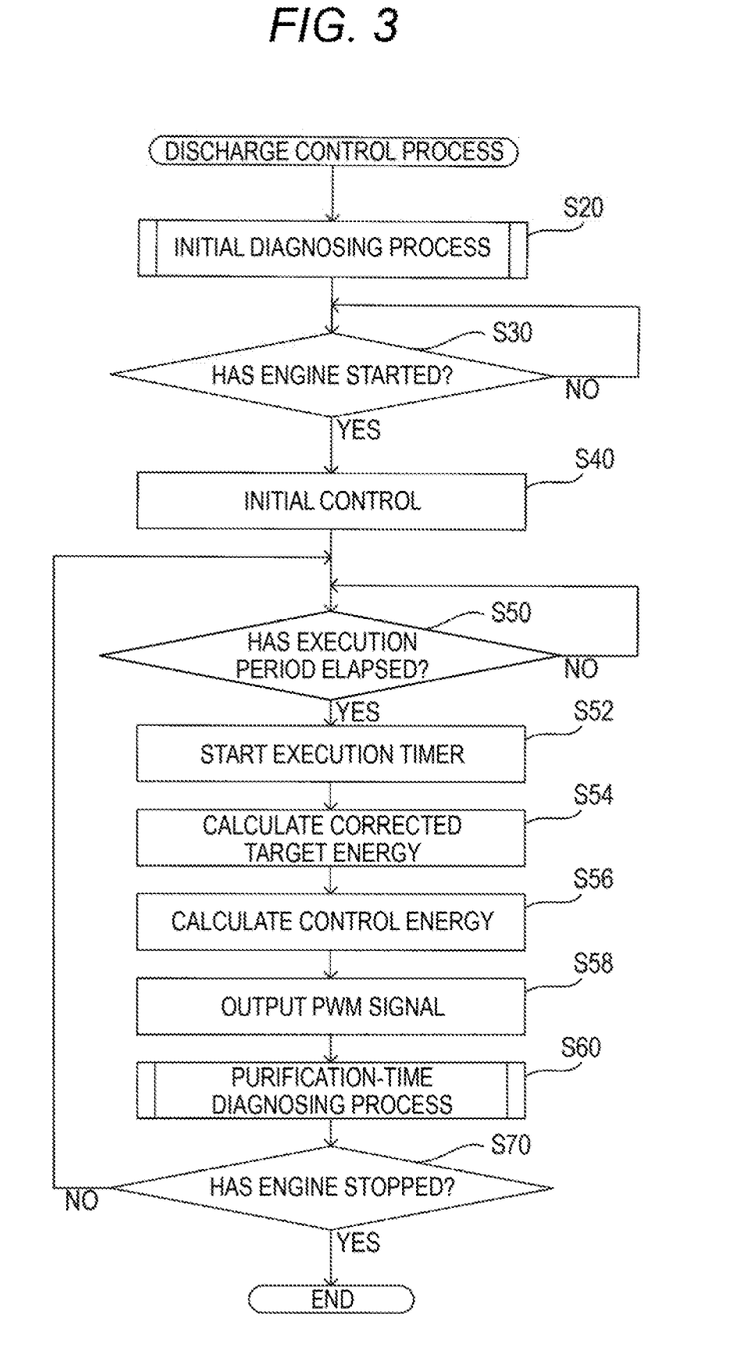
FIG. 3 is a flowchart showing a discharge control process.

Next, the steps of a discharge control process executed by the CPU 51 of the discharge control apparatus 6 will be described. The discharge control process is started immediately after the microcomputer 31 starts its operation upon supply of power to the discharge control apparatus 6 as a result of switching of an accessory power supply of the vehicle from an off state to an on state.

As shown in FIG. 3, in the discharge control process, the CPU 51 first executes an initial diagnosing process in S20.

Figure 4:
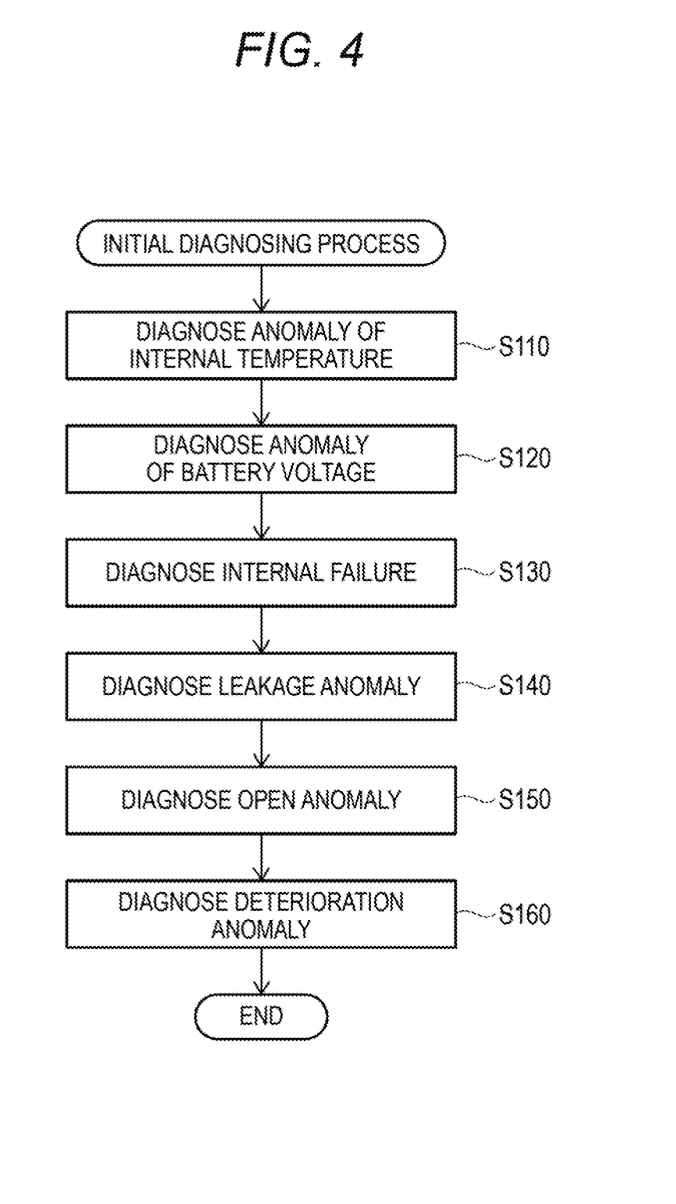
FIG. 4 is a flowchart showing an initial diagnosing process.

Here, the steps of the initial diagnosing process will be described.

As shown in FIG. 4, in initial diagnosing process, the CPU 51 first diagnoses an anomaly of the internal temperature of the transformer 4 in S110. Specifically, the CPU 51 determines whether or not the temperature indicated by the detection signal from the temperature sensor 7 (hereinafter referred to as the "power supply circuit internal temperature") falls within a predetermined operating temperature range (in the present embodiment, for example, −40° C. to +85° C.) set beforehand. In the case where the power supply circuit internal temperature falls within the operating temperature range, the CPU 51 clears an initial temperature anomaly flag provided in the RAM 53. Meanwhile, in the case where the power supply circuit internal temperature falls outside the operating temperature range, the CPU 51 sets the initial temperature anomaly flag.

Next, in S120, the CPU 51 diagnoses an anomaly of the voltage of the battery 5. Specifically, the CPU 51 determines, based on the voltage input from the voltage detection circuit 39 to the voltage input terminal 55, whether or not the voltage of the battery 5 (hereinafter referred to as the "power supply voltage") falls within an operating voltage range (in the present embodiment, for example, 10 V to 16 V) set beforehand. In the case where the power supply voltage falls within the operating voltage range, the CPU 51 clears an initial voltage anomaly flag provided in the RAM 53. Meanwhile, in the case where the power supply voltage falls outside the operating voltage range, the CPU 51 sets the initial voltage anomaly flag.

Next, in S130, the CPU 51 diagnoses an internal failure of the transformer 4. Specifically, the CPU 51 first outputs from the voltage output terminal 54 a PWM signal having a previously set duty ratio for initial diagnosis. As a result, the plasma reactor 3 generates discharge at an energy level lower than that for the discharge generated in S50 described below, thereby generating plasma. When the driver 32 is in the on state, the CPU 51 determines, based on the voltage $V_{ip}$ input from the current detection circuit 37 to the voltage input terminal 57, whether or not the magnitude of the current having flowed to the primary coil 21 (hereinafter referred to as the "primary coil current value") is smaller than a transformer wire-breakage determination value set beforehand. In the case where the primary coil current value is smaller than the transformer wire-breakage determination value, the CPU 51 sets an initial wire-breakage anomaly flag provided in the RAM 53. Meanwhile, in the case where the primary coil current value is equal to or larger than the transformer wire-breakage determination value, the CPU 51 clears the initial wire-breakage anomaly flag.

Next, in S140, the CPU 51 diagnoses a leakage anomaly of the plasma reactor 3.

First, a method of detecting a short circuit of the plasma reactor 3 will be described.

Figure 6:
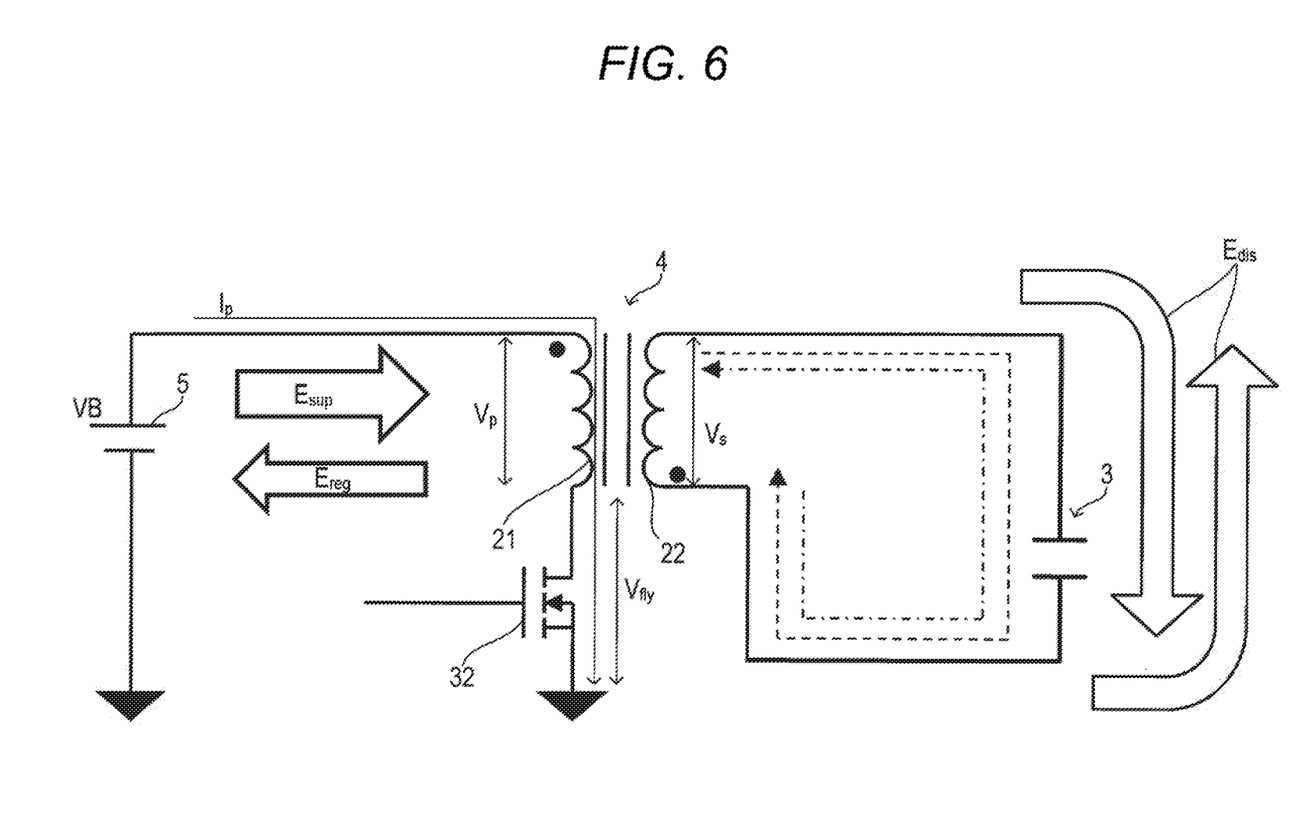
FIG. 6 is a circuit diagram showing flows of energy due to discharge.

As shown in FIG. 6, when the driver 32 is switched from the off state to the on state, a primary current $I_p$ flows to the primary coil 21, and an inter-terminal voltage $V_p$ of the primary coil 21 (hereinafter referred to as the "primary inter-terminal voltage $V_p$") is generated, whereby supply energy $E_{sup}$ is stored in the primary coil 21. When the driver 32 is switched from the on state to the off state after that, the supply energy $E_{sup}$ stored in the primary coil 21 is conveyed to the secondary coil 22. As a result, a high voltage is generated in the secondary coil 22, and discharge is generated in the plasma reactor 3. At that time, a flyback voltage $V_{fly}$ is generated between the drain and the source of the driver 32.

The inter-terminal voltage of the secondary coil 22 will be referred to as the "secondary inter-terminal voltage $V_s$." The energy consumed by the discharge in the plasma reactor 3 will be referred to as the "discharge energy $E_{dis}$." Since the plasma reactor 3 is a capacitive load, the energy not consumed by the discharge is returned to the primary side. This energy will be referred to as the "regeneration energy $E_{reg}$."

Accordingly, a relation represented by Equation (3) holds between the supply energy $E_{sup}$ and "the discharge energy $E_{dis}$ and the regeneration energy $E_{reg}$." When the discharge energy $E_{dis}$ is small, the supply energy $E_{sup}$ and the regeneration energy $E_{reg}$ are approximately equal to each other. Namely, a relation represented by Equation (4) holds between the supply energy $E_{sup}$ and the regeneration energy $E_{reg}$. In the case where a leakage current flows in the plasma reactor 3, a relation represented by Equation (5) holds, where $E_{leak}$ represents the leakage energy which is the energy consumed as a result of the flow of the leak current in the plasma reactor 3.

Therefore, when a leakage current flows within the plasma reactor 3 in a state in which the discharge energy $E_{dis}$ is small, a relation represented by Equation (6) holds.

[Expression 2]

$$E_{sup} = E_{reg} + E_{dis} \quad (3)$$

$$E_{sup} \approx E_{reg} \quad (4)$$

$$E_{sup} = E_{reg} + E_{leak} \quad (5)$$

$$E_{sup} > E_{reg} \quad (6)$$

Figure 7:
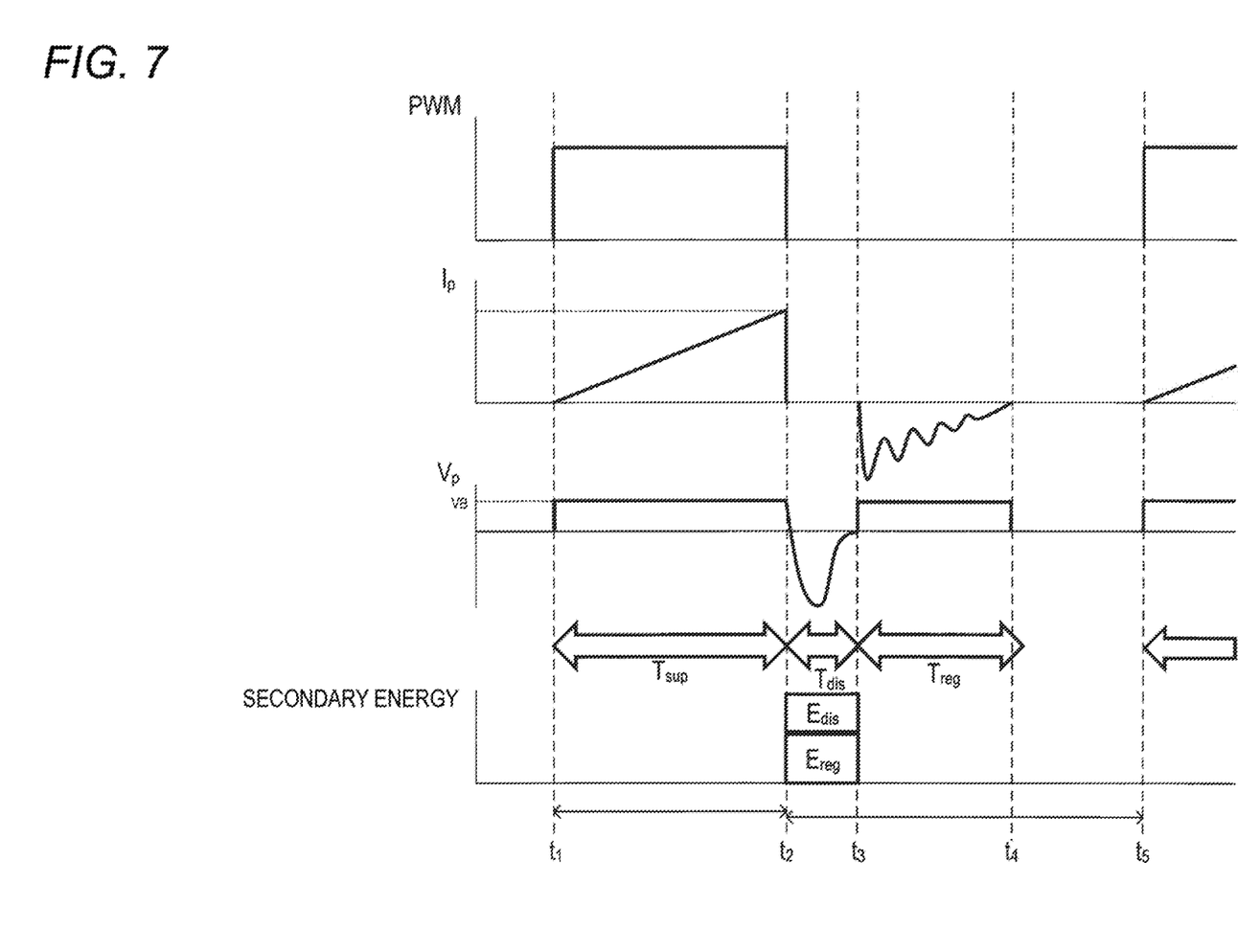
FIG. 7 is a timing chart showing changes in PWM signal, primary current, primary inter-terminal voltage, and secondary energy.

As shown in FIG. 7, when the PWM signal changes from the low level to the high level at time $t_1$, the primary current $I_p$ increases gradually, and the primary inter-terminal voltage $V_p$ becomes equal to the power supply voltage VB. Subsequently, when the PWM signal changes from the high level to the low level at time $t_2$, the primary current $I_p$ decreases sharply and becomes 0 [A], the primary inter-terminal voltage $V_p$ decreases sharply to the negative side from the power supply voltage VB, and discharge is generated in the plasma reactor 3. The generation of discharge continues from time $t_2$ to time $t_3$. After the discharge ends, the primary current $I_p$ attenuates while oscillating on the negative side, and becomes 0 [A] at time $t_4$. The primary inter-terminal voltage $V_p$ becomes equal to the power supply voltage VB in the period between time $t_3$ and time $t_4$, and becomes 0 [V] at time $t_4$. Subsequently, the state in which the primary current $I_p$ is 0 I[A] and the primary inter-terminal voltage $V_p$ is 0 [V] continues up to time $t_s$ when the PWM signal again changes from a low level to a high level.

Namely, the period from time $t_1$ to time $t_2$ is an energy supply period $T_{sup}$. The period from time $t_2$ to time $t_3$ is a discharge period $T_{dis}$. The period from time $t_3$ to time $t_4$ is a regeneration period $T_{reg}$.

Figure 8:
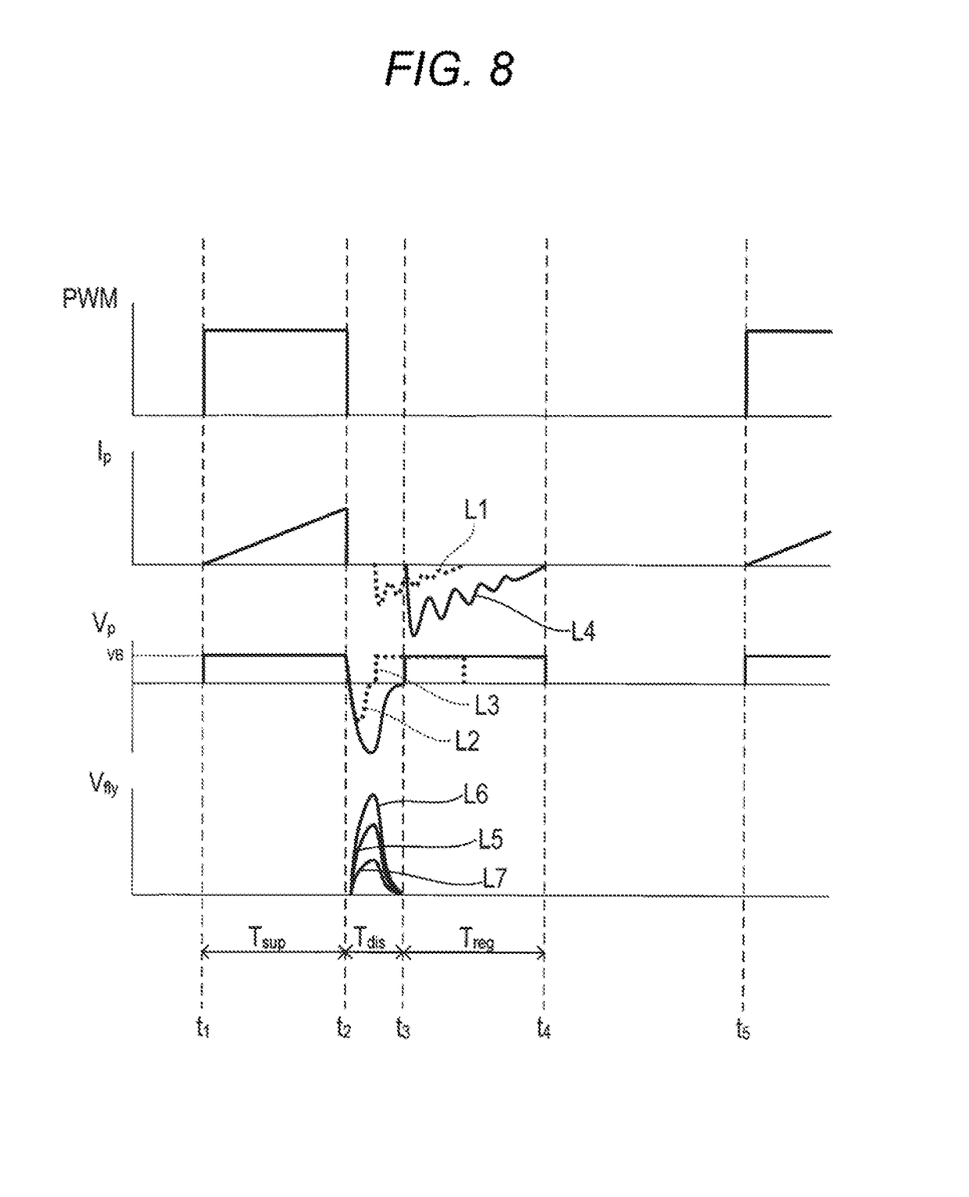
FIG. 8 is a timing chart showing changes in PWM signal, primary current, primary inter-terminal voltage, and flyback voltage.

In FIG. 8, a curve L1 represented by a broken line shows the primary current $I_p$ for the case where a leakage current flows in the plasma reactor 3. A curve L2 represented by a broken line and a bent line L3 represented by a broken line show the primary inter-terminal voltage $V_p$ for the case where a leakage current flows in the plasma reactor 3. A curve L4 represented by a continuous line shows the primary current $I_p$ for the case where no leakage current flows in the plasma reactor 3. As shown by the curves L1 and L4, when a leakage current flows in the plasma reactor 3, the absolute value of the primary current $I_p$ in the regeneration period $T_{reg}$ decreases. Therefore, when a leakage current flows in the plasma reactor 3, the regeneration energy $E_{reg}$ decreases.

Accordingly, in S140, the CPU 51 first outputs from the voltage output terminal 54 a PWM signal having a previously set duty ratio for initial diagnosis. The duty ratio for initial diagnosis is set so as to establish a no-discharge state in which no discharge is generated in the plasma reactor 3 or a low discharge state in which the discharge energy in the plasma reactor 3 is small. Notably, the expression "the discharge energy is small" means that the amount of discharge is, for example, 10% or less of the maximum discharge amount of the plasma reactor 3.

The CPU 51 then calculates the supply energy $E_{sup}$ in accordance with Equation (7) based on the supply current integration voltage $V_{isi}$ input to the voltage input terminal 58. The CPU 51 also calculates the regeneration energy $E_{reg}$ in accordance with Equation (8) on the basis of the regeneration current integration voltage $V_{iri}$ input to the voltage input terminal 59.

Notably, $R_{sh}$ in Equations (7) and (8) represents the resistance of the resistor 34. $R_{gs}$ in Equation (7) represents the resistance of the resistor 62. $C_{gs}$ in Equation (7) represents the capacitance of the capacitor 63. $R_{gr}$ in Equation (8) represents the resistance of the resistor 67. $C_{gr}$ in Equation (8) represents the capacitance of the capacitor 68.

The supply energy $E_{sup}$ calculated in accordance with Equation (7) corresponds to the supply energy $E_{sup}$ calculated in accordance with Equation (9). The regeneration energy $E_{reg}$ calculated in accordance with Equation (8) corresponds to the regeneration energy $E_{reg}$ calculated in accordance with Equation (10). Time $t_1$ in Equation (9) corresponds to time $t_1$ in FIG. 7. Time $t_2$ in Equation (9) corresponds to time $t_2$ in FIG. 7. Time $t_3$ in Equation (10) corresponds to time $t_3$ in FIG. 7. Time $t_5$ in Equation (10) corresponds to time $t_5$ in FIG. 7.

[Expression 3]

$$E_{sup} = \frac{C_{gs} R_{gs} V_{isi}}{R_{sh}} \times VB \quad (7)$$

-continued $$E_{reg} = \frac{C_{gr} R_{gr} V_{iri}}{R_{sh}} \times VB \qquad (8)$$

$$E_{sup} = \int_{t_1}^{t_2} V_p \cdot I_p \, dt \qquad (9)$$

$$E_{reg} = \int_{t_3}^{t_5} V_p \cdot I_p \, dt \qquad (10)$$

Subsequently, the CPU 51 determines whether or not the calculated supply energy $E_{sup}$ and the calculated regeneration energy $E_{reg}$ satisfy the relation represented by Equation (6). Namely, the CPU 51 determines whether or not the supply energy $E_{sup}$ is larger than the regeneration energy $E_{reg}$. In the case where the supply energy $E_{sup}$ is larger than the regeneration energy $E_{reg}$, the CPU 51 sets an initial leakage flag provided in the RAM 53. Meanwhile, in the case where the supply energy $E_{sup}$ is equal to or smaller than the regeneration energy $E_{reg}$, the CPU 51 clears the initial leakage flag.

After completing the process of S140, as shown in FIG. 4, the CPU 51 diagnoses an open anomaly of the plasma reactor 3 in S150. The open anomaly of the plasma reactor 3 means the occurrence of breakage of the plasma reactor 3 or wire breakage in the plasma reactor 3.

First, a method of detecting the open anomaly of the plasma reactor 3 will be described.

Figure 9:
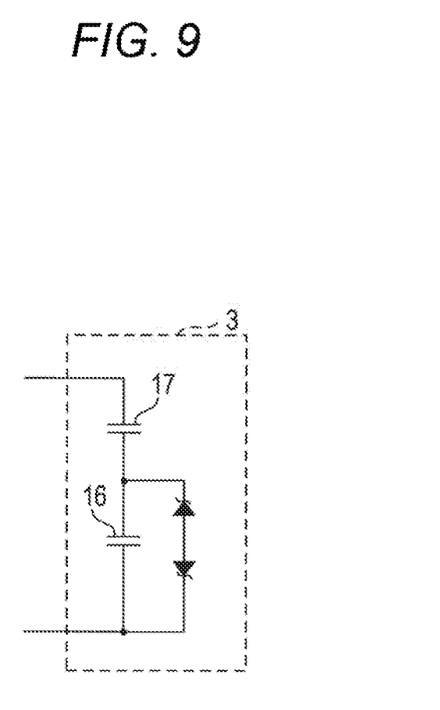
FIG. 9 is a diagram showing an equivalent circuit of the plasma reactor.

As shown in FIG. 9, the equivalent circuit of the plasma reactor 3 is represented by a capacitor 16 and a capacitor 17 connected in series to the capacitor 16.

When the capacitance of the plasma reactor 3 is denoted by $C_c$, the capacitance of the capacitor 16 is denoted by $C_g$, and the capacitance of the capacitor 17 is denoted by $C_d$, the capacitance of the plasma reactor 3 is represented by Equation (1). Notably, $C_d > C_g$.

The supply energy $E_{sup}$ is represented by Equation (12). The secondary inter-terminal voltage $V_s$ is represented by Equation (13) obtained from Equation (12).

[Expression 4]

$$C_c = \frac{C_d C_g}{C_d + C_g} \qquad (11)$$

$$E_{sup} = \frac{1}{2} \cdot C_c \cdot V_s^2 \qquad (12)$$

$$V_s = \sqrt{\frac{2 E_{sup}}{C_c}} \qquad (13)$$

When the number of turns of the primary coil 21 is denoted by n and the number of turns of the secondary coil 22 is denoted by m, the flyback voltage $V_{fly}$ is represented by Equation (14). Therefore, the flyback voltage $V_{fly}$ is represented by Equation (15) obtained from Equation (13) and Equation (14).

When breakage or wire breakage occurs in the plasma reactor 3, the capacitance $C_d$ of the capacitor 17 decreases. When the capacitance of the capacitor 17 in a state in which the plasma reactor 3 is broken or suffers wire breakage is denoted by $C_{do}$, the relation represented by Equation (16) holds.

Further, when the capacitance of the plasma reactor 3 in a state in which the plasma reactor 3 is broken or suffers wire breakage is denoted by $C_{open}$, the relation represented by Equation (17) holds.

[Expression 5]

$$V_{fly} = \frac{n}{m} \cdot V_s \qquad (14)$$

$$V_{fly} = \frac{n}{m} \cdot \sqrt{\frac{2 E_{sup}}{C_c}} \qquad (15)$$

$$C_{do} \ll C_g \qquad (16)$$

$$C_{open} = \frac{C_{do} C_g}{C_{do} + C_g} \ll C_g \qquad (17)$$

Accordingly, the flyback voltage $V_{fly}$ in the case where the plasma reactor 3 is broken or suffers wire breakage is greater than the flyback voltage $V_{fly}$ in the case where the plasma reactor 3 is not broken and does not suffer wire breakage.

As shown in FIG. 8, the flyback voltage $V_{fly}$ is generated in the discharge period $T_{dis}$. A curve L5 represented by a continuous line shows the flyback voltage $V_{fly}$ for the case where the plasma reactor 3 is normal. A curve L6 represented by a continuous line shows the flyback voltage $V_{fly}$ for the case where the plasma reactor 3 is broken or suffers wire breakage.

Accordingly, in S150, the CPU 51 first outputs from the voltage output terminal 54 the PWM signal having a duty ratio for initial diagnosis. The CPU 51 then calculates the flyback voltage $V_{fly}$ based on the voltage input from the voltage detection circuit 40 to the voltage input terminal 56. Subsequently, the CPU 51 determines whether or not the calculated flyback voltage $V_{fly}$ is higher than an open determination voltage set beforehand. In the case where the flyback voltage $V_{fly}$ is higher than the open determination voltage, the CPU 51 sets an initial open flag provided in the RAM 53. Meanwhile, in the case where the flyback voltage $V_{fly}$ is equal to or lower than the open determination voltage, the CPU 51 clears the initial open flag.

After completing the process of S150, as shown in FIG. 4, the CPU 51 diagnoses a deterioration anomaly of the plasma reactor 3 in S160. The deterioration anomaly of the plasma reactor 3 means, for example, that of the space between the discharge electrode 11 and the discharge electrode 12 is clogged with soot.

First, a method of detecting deterioration of the plasma reactor 3 will be described.

When the space between the discharge electrode 11 and the discharge electrode 12 is clogged with soot, the capacitance $C_g$ of the capacitor 16 increases. When the capacitance $C_g$ of the capacitor 16 in a state in which clogging with soot has occurred in the plasma reactor 3 is denoted by $C_{gc}$, the relation represented by Equation (18) holds.

Further, when the capacitance of the plasma reactor 3 in the state in which clogging with soot has occurred in the plasma reactor 3 is denoted by $C_{clog}$, the relation represented by Equation (19) holds.

[Expression 6]

$$C_{gc} \gg C_d \qquad (18)$$

$$C_{clog} = \frac{C_d C_{gc}}{C_d + C_{gc}} \gg C_c \qquad (19)$$

Accordingly, the flyback voltage $V_{fly}$ in the case where clogging with soot has occurred is smaller than the flyback voltage $V_{fly}$ in the case where clogging with soot has not yet occurred.

As shown in FIG. 8, the flyback voltage $V_{fly}$ is generated in the discharge period Tdis. The curve L5 represented by a continuous line shows the flyback voltage $V_{fly}$ for the case where the plasma reactor 3 is normal. A curve L7 represented by a continuous line shows the flyback voltage $V_{fly}$ for the case where clogging with soot has occurred in the plasma reactor 3.

Accordingly, in S160, the CPU 51 first outputs from the voltage output terminal 54 a PWM signal having a duty ratio for initial diagnosis. The CPU 51 then calculates the flyback voltage $V_{fly}$ based on the voltage input from the voltage detection circuit 40 to the voltage input terminal 56. Subsequently, the CPU 51 determines whether or not the calculated flyback voltage $V_{fly}$ is lower than a deterioration determination voltage set beforehand. In the case where the flyback voltage $V_{fly}$ is lower than the deterioration determination voltage, the CPU 51 sets an initial deterioration flag provided in the RAM 53. Meanwhile, in the case where the flyback voltage $V_{fly}$ is equal to or higher than the deterioration determination voltage, the CPU 51 clears the initial deterioration flag.

After completing the S160 process, the CPU 51 ends the initial diagnosing process as shown in FIG. 4.

After completing the initial diagnosing process, as shown in FIG. 3, in S30, the CPU 51 determines, based on engine drive information received periodically from the engine ECU 2, whether or not the vehicle engine has started. The engine drive information is information representing the operating state of the engine (for example, the engine rotational speed).

In the case where the engine has not yet started, the CPU 51 waits until the engine starts by repeating the process of S30. When the engine starts, the CPU 51 executes initial control in S40. Specifically, the CPU 51 outputs from the voltage output terminal 54 a PWM signal having a maximum duty ratio set beforehand (in the present embodiment, for example, 45%), thereby generating plasma in the plasma reactor 3.

The CPU 51 then obtains data of consumed energy, exhaust gas temperature, soot density, and atmospheric pressure in the period during which the plasma reactor 3 is driven at the maximum duty ratio (hereinafter referred to as the "initial drive period").

The consumed energy is the energy consumed by the discharge in the plasma reactor 3 during the initial drive period. The CPU 51 repeatedly calculates the supply energy $E_{sup}$ and the regeneration energy $E_{reg}$ during the initial drive period. Also, during the initial drive period, the CPU 51 repeatedly calculates the difference between the supply energy $E_{sup}$ and the regeneration energy $E_{reg}$ by subtracting the regeneration energy $E_{reg}$ from the supply energy $E_{sup}$. Also, the CPU 51 integrates the difference calculated during the initial drive period, thereby calculating the consumed energy. The CPU 51 uses the calculated value of the consumed energy as the data of the consumed energy.

Also, the CPU 51 receives, during the initial drive period, exhaust gas temperature information transmitted periodically from the engine ECU 2 and uses, as the data of the exhaust gas temperature, the value of the exhaust gas temperature represented by the received exhaust gas temperature information. The CPU 51 receives, during the initial drive period, soot density information transmitted periodically from the engine ECU 2 and uses, as the data of the soot density, the value of the soot density represented by the received soot density information. The CPU 51 receives, during the initial drive period, atmospheric pressure information transmitted periodically from the engine ECU 2 and uses, as the data of the atmospheric pressure, the value of the atmospheric pressure represented by the received atmospheric pressure information.

Further, the CPU 51 calculates the amount of soot removed during the initial drive period (hereinafter referred to as the "initial removed soot amount") based on the data of the soot density obtained during the initial drive period. Subsequently, the CPU 51 determines a correction coefficient with reference to a correction coefficient calculation map in which the correction coefficient is set beforehand while the consumed energy, the initial removed soot amount, the exhaust gas temperature, and the atmospheric pressure are used as parameters. The correction coefficient is used in the process of S54.

Next, in S50, the CPU 51 determines whether or not an execution period (in the present embodiment, for example, 1 sec) set beforehand has elapsed. Specifically, the CPU 51 determines whether or not the value of an execution timer provided in the RAM 53 is equal to or greater than a value corresponding to the execution period. The execution timer is a timer which is incremented (namely, one is added to the value of the timer) at intervals of, for example, 1 ms. When the execution timer is started, its value is incremented from 0.

In the case where the execution period has not yet elapsed, the CPU 51 waits until the execution period elapses by repeating the process of S50. When the execution period elapses, the CPU 51 starts the execution timer in S52.

Next, in S54, the CPU 51 determines a target consumed energy based on the obtained latest data of the exhaust gas temperature, the soot density, and the atmospheric pressure, while referring to a target calculation map in which the target consumed energy is set beforehand while the exhaust gas temperature, the soot density, and the atmospheric pressure are used as parameters. Furthermore, the CPU 51 calculates a corrected target energy by multiplying the determined target consumed energy by the correction coefficient determined in S40.

Also, in S56, the CPU 51 calculates the supply energy $E_{sup}$ based on the inputted latest supply current integration voltage $V_{isi}$ in accordance with Equation (7). Also, the CPU 51 calculates the regeneration energy $E_{reg}$ based on the inputted latest regeneration current integration voltage $V_{iri}$ in accordance with Equation (8). Further, the CPU 51 calculates a control energy by subtracting the calculated regeneration energy $E_{reg}$ from the calculated supply energy $E_{sup}$.

Subsequently, in S58, the CPU 51 calculates the duty ratio of the PWM signal such that the deviation between the calculated corrected target energy and the calculated control energy becomes zero through, for example, feedback control using a proportional gain, an integral gain, and a derivative gain (i.e., PID control). The CPU 51 then outputs from the voltage output terminal 54 a PWM signal having the calculated duty ratio.

Next, the CPU 51 executes a purification-time diagnosing process in S60.

Figure 5:
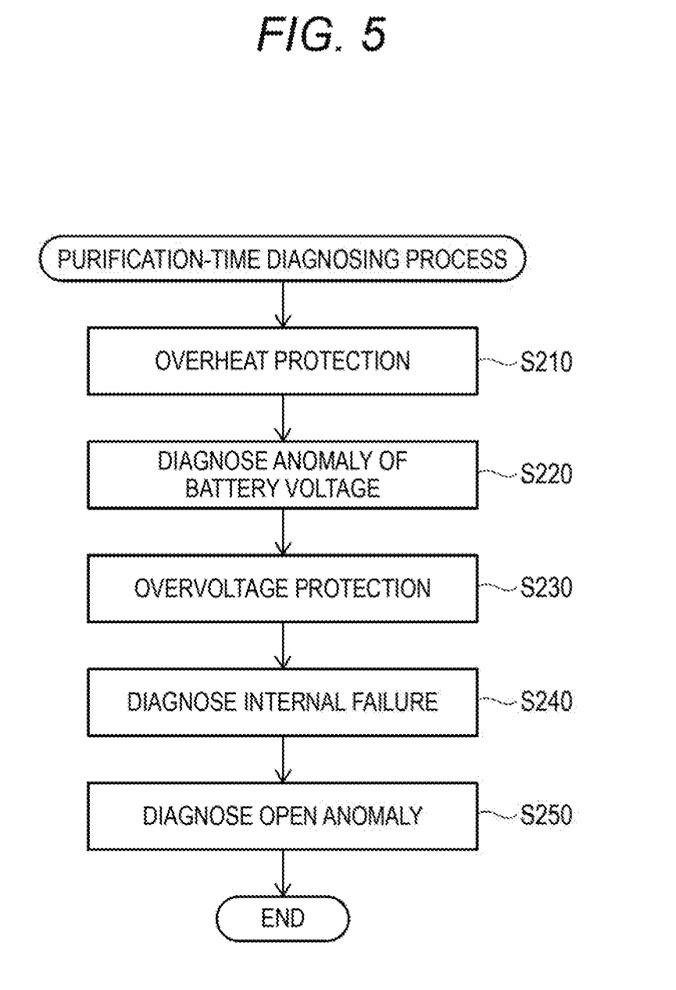
FIG. 5 is a flowchart showing a purification-time diagnosing process.

Here, the steps of the purification-time diagnosing process will be described.

In the purification-time diagnosing process, as shown in FIG. 5, the CPU 51 first performs a process of protecting the driver 32 from overheating in S210. Specifically, the CPU 51 first determines whether or not the temperature represented by the detection signal from the temperature sensor 8 (hereinafter referred to as the "driver temperature") is equal to or higher than a failure determination temperature set beforehand. In the case where the driver temperature is equal to or higher than the failure determination temperature, the CPU 51 sets a driver overheat flag provided in the RAM 53, and prohibits the output of the PWM signal from the voltage output terminal 54. Meanwhile, in the case where the driver temperature is lower than the failure determination temperature, the CPU 51 clears the driver overheat flag.

Next, in S220, the CPU 51 diagnoses an anomaly of the voltage of the battery 5. Specifically, the CPU 51 determines whether or not the power supply voltage falls within the operating voltage range in a manner similar to that in S120. In the case where the power supply voltage falls within the operating voltage range, the CPU 51 clears a purification-time voltage anomaly flag provided in the RAM 53. Meanwhile, in the case where the power supply voltage falls outside the operating voltage range, the CPU 51 sets the purification-time voltage anomaly flag.

Next, in S230, the CPU 51 executes a process of protecting the driver 32 from overvoltage. Specifically, the CPU 51 first calculates the flyback voltage $V_{fly}$ based on the voltage input from the voltage detection circuit 40 to the voltage input terminal 56. Subsequently, the CPU 51 determines whether or not the calculated flyback voltage $V_{fly}$ is equal to or higher than a failure determination voltage set beforehand. In the case where the flyback voltage $V_{fly}$ is equal to or higher than the failure determination voltage, the CPU 51 sets a driver overvoltage flag provided in the RAM 53, and prohibits the output of the PWM signal from the voltage output terminal 54. Meanwhile, in the case where the flyback voltage $V_{fly}$ is lower than the failure determination voltage, the CPU 51 clears the driver overvoltage flag.

Next, in S240, the CPU 51 diagnoses an internal failure of the transformer 4. Specifically, as in S130, when the driver 32 is in the on state, the CPU 51 determines, based on the voltage $V_{ip}$ input from the current detection circuit 37 to the voltage input terminal 57, whether or not the primary coil current value is smaller than the transformer wire-breakage determination value. In the case where the primary coil current value is smaller than the transformer wire-breakage determination value, the CPU 51 sets a purification-time wire-breakage anomaly flag provided in the RAM 53. Meanwhile, in the case where the primary coil current value is equal to or larger than the transformer wire-breakage determination value, the CPU 51 clears the purification-time wire-breakage anomaly flag.

Next, in S250, the CPU 51 diagnoses an open anomaly of the plasma reactor 3. Specifically, the CPU 51 first calculates the flyback voltage $V_{fly}$ based on the voltage input from the voltage detection circuit 40 to the voltage input terminal 56 in a manner similar to that in S150. The CPU 51 then determines whether or not the calculated flyback voltage $V_{fly}$ is higher than the open determination voltage. In the case where the flyback voltage $V_{fly}$ is higher than the open determination voltage, the CPU 51 sets a purification-time open flag provided in the RAM 53. Meanwhile, in the case where the flyback voltage $V_{fly}$ is equal to or lower than the open determination voltage, the CPU 51 clears the purification-time open flag.

After completing the S250 process, the CPU 51 ends the purification-time diagnosing process.

After ending the purification-time diagnosing process, as shown in FIG. 3, in S70, the CPU 51 determines, based on the engine drive information received periodically from the engine ECU 2, whether or not the engine of the vehicle has stopped. In the case where the engine has not yet stopped, the CPU 51 proceeds to S50. Meanwhile, in the case where the engine stops, the CPU 51 ends the discharge control process.

Figure 10:
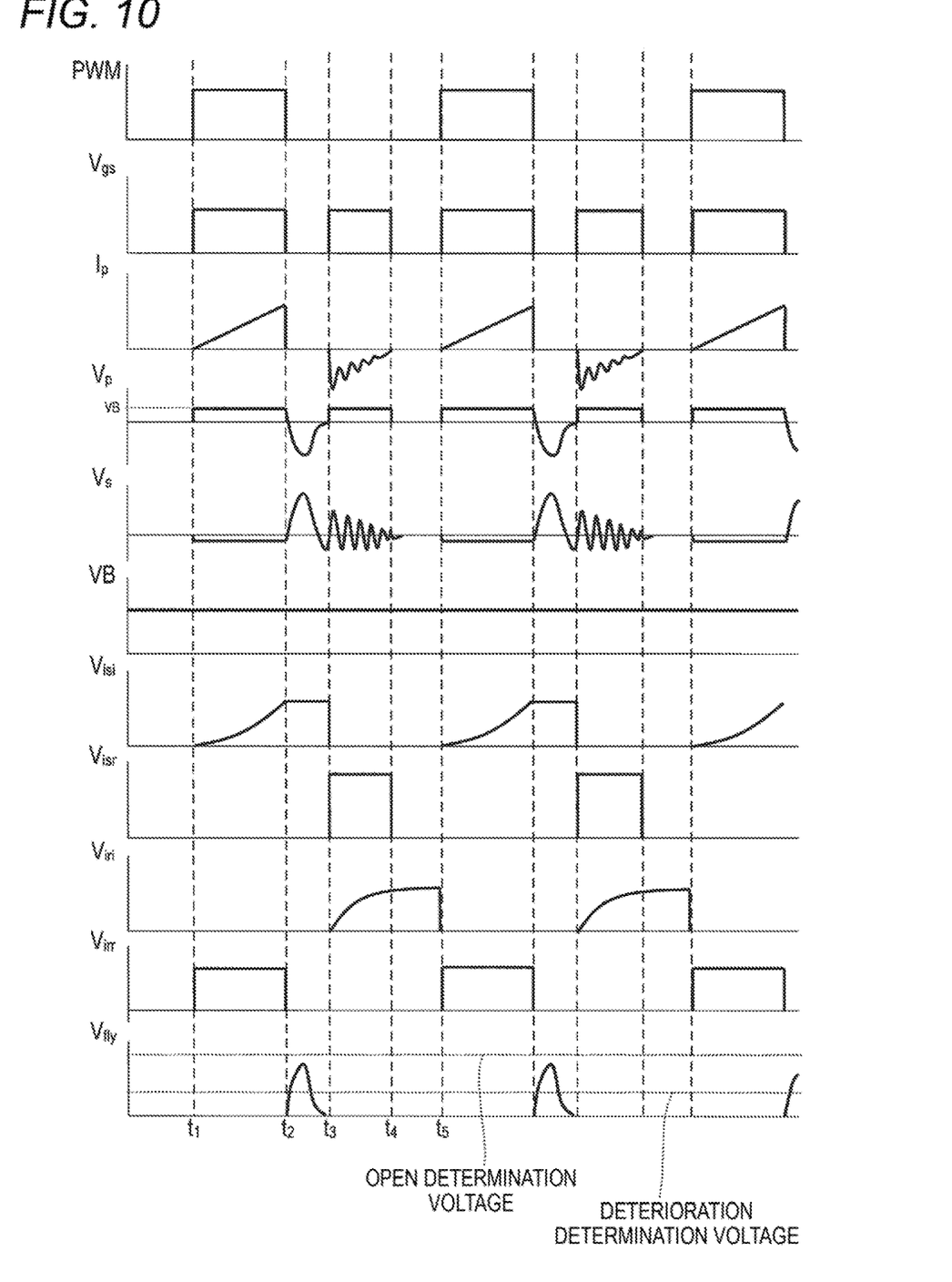
FIG. 10 is a timing chart showing a specific example of operation of the discharge control apparatus.

Next, a specific example of operation of the discharge control apparatus 6 will be described.

As shown in FIG. 10, when the PWM signal changes from the low level to the high level at time $t_1$, the gate control voltage $V_{gs}$ changes from the low level to the high level. As a result, the primary current $I_p$ increases gradually, and the primary inter-terminal voltage $V_p$ becomes equal to the power supply voltage VB. Also, as a result of the increase in the primary current $I_p$, the supply current integration voltage $V_{isi}$ increases gradually.

When the PWM signal changes from the high level to the low level at time $t_2$, the gate control voltage $V_{gs}$ changes from the high level to the low level. As a result, the primary current $I_p$ decreases sharply and becomes 0 [A]. Also, the primary inter-terminal voltage $V_p$ decreases sharply to the negative side, and the secondary inter-terminal voltage $V_s$ increases sharply, so that discharge is generated in the plasma reactor 3. Also, the flyback voltage $V_{fly}$ increases sharply.

The discharge generation continues from time $t_2$ to time $t_3$. After the discharge ends, the primary current $I_p$ attenuates while oscillating on the negative side, and becomes 0 [A] at time $t_4$. The primary current $I_p$ flowing from time $t_3$ to time $t_4$ is the regeneration current. The primary inter-terminal voltage $V_p$ becomes equal to the power supply voltage VB in the period between time $t_3$ and time $t_4$, and becomes 0 [V] at time $t_4$. The secondary inter-terminal voltage $V_s$ attenuates while oscillating between the positive and negative sides in the period between time $t_3$ and time $t_4$.

Also, due to the primary current $I_p$ flowing from time $t_3$ to time $t_4$, the regeneration current integration voltage $V_{iri}$ increases gradually. Also, the output voltage $V_{isr}$ of the regeneration detection circuit 38 changes from the low level to the high level at time t and changes from the high level to the low level at time $t_4$. When the output voltage $V_{isr}$ changes from the low level to the high level, the supply current integration voltage $V_{isi}$ is reset to 0 [V]. Notably, in accordance with the output voltage $V_{isr}$ of the regeneration detection circuit 38, the gate control voltage $V_{gs}$ changes from the low level to the high level at time it and changes from high level to the low level at time $t_4$.

When the voltage $V_{irr}$ of the voltage output terminal 54 changes from the low level to the high level at time $t_5$ at which the gate control voltage $V_{gs}$ changes from the low level to the high level, the regeneration current integration voltage $V_{iri}$ is reset to 0 [V].

The discharge control apparatus 6 configured as described above controls the flyback power supply circuit. The power supply circuit comprises the transformer 4 having the primary coil 21 and the secondary coil 22 and which performs voltage conversion, and the driver 32 for controlling energization of the primary coil 21. The power supply circuit supplies electric energy to the plasma reactor 3 which generates plasma by discharge.

The discharge control apparatus 6 calculates, based on the primary current $I_p$ flowing through the primary coil 21 and the inter-terminal voltage $V_p$ generated in the primary coil 21, the supply energy $E_{sup}$ supplied to the primary coil 21 and the regeneration energy $E_{reg}$ which is a portion of the supply energy $E_{sup}$ not used for the discharge in the plasma reactor 3.

The discharge control apparatus 6 controls the power supply circuit based on the calculated supply energy $E_{sup}$ and the calculated regeneration energy $E_{reg}$.

As described above, the discharge control apparatus 6 calculates the supply energy $E_{sup}$ and the regeneration energy $E_{reg}$ based on the primary current $I_p$ flowing through the primary coil 21 and the inter-terminal voltage $V_p$ generated in the primary coil 21, and controls the power supply circuit based on the supply energy $E_{sup}$ and the regeneration energy $E_{reg}$. By virtue of this configuration, the discharge control apparatus 6 can control the power supply circuit without use of the secondary current flowing through the secondary coil 22 and the secondary voltage generated in the secondary coil 22. Therefore, the discharge control apparatus 6 can eliminate the necessity of a component or assembly for securing insulation, thereby reducing production cost or simplifying apparatus configuration.

In the above-described embodiment, the transformer 4 and the driver 32 correspond to the power supply circuit; and the inter-terminal voltage $V_p$ corresponds to the primary voltage.

Also, S56 corresponds to the process performed by the energy calculation section and the process performed as the energy calculation step, and S58 corresponds to the process performed by the control section and the process performed as the control step.

One embodiment of the present disclosure has been described; however, the present disclosure is not limited to the above-described embodiment and various modifications are possible.

For example, in the above-described embodiment, the supply energy $E_{sup}$ and the regeneration energy $E_{reg}$ are calculated using Equations (7) and (8). However, the supply energy $E_{sup}$ and the regeneration energy $E_{reg}$ may be calculated using Equations (9) and (10).

Also, the function of one constituent element in the above-described embodiment may be distributed to a plurality of constituent elements, or the functions of a plurality of constituent elements may be realized by one constituent element. Part of the configuration of the above-described embodiment may be omitted. Also, at least part of the configuration of the above-described embodiment may be added to or partially replace the configurations of other embodiments.

The present disclosure may be realized in various forms other than the above-described discharge control apparatus 6. For example, the present disclosure may be realized as a system including the discharge control apparatus 6 as a constituent element, a program for causing a computer to function as the discharge control apparatus 6, a non-transitory tangible recording medium, such as semiconductor memory, on which the program is recorded, and a discharge control method.

The invention has been described in detail with reference to the above embodiments. However, the invention should not be construed as being limited thereto. It should further be apparent to those skilled in the art that various changes in form and detail of the invention as shown and described above may be made. It is intended that such changes be included within the spirit and scope of the claims appended hereto.

This application is based on Japanese Patent Application No. JP 2019-067882 filed Mar. 29, 2019, the disclosure of which is incorporated herein by reference in its entirety.

What is claimed is:

1. A discharge control apparatus for controlling a flyback power supply circuit which includes a transformer having a primary coil and a secondary coil and which performs voltage conversion, and a driver for controlling energization of the primary coil and which supplies electric energy to a plasma reactor which generates plasma by discharge,
the discharge control apparatus comprising a processor configured to:
measure primary current flowing through the primary coil;
measure primary voltage generated in the primary coil;
calculate, supply energy supplied to the primary coil in accordance with the following Equation (1) and regeneration energy which is a portion of the supply energy not used for the discharge in the plasma reactor in accordance with the following Equation (2):

$$E_{sup} = \int_{t_1}^{t_2} V_p \cdot I_p \, dt \qquad (1)$$

$$E_{reg} = \int_{t_3}^{t_5} V_p \cdot I_p \, dt \qquad (2)$$

wherein $E_{sup}$ represents the supply energy, $E_{reg}$ represents the regeneration energy, $I_p$ represents the value of the primary current, $V_p$ represents the value of the primary voltage, and wherein a first time period during which the supply energy is generated is denoted as a first period from time $t_1$ to time $t_2$ and a second time period during which the regeneration energy is generated is denoted as a second period from time $t_3$ to time $t_5$;
compare the supply energy and the regeneration energy; and
control the power supply circuit based on a comparison of the supply energy and the regeneration energy.

2. A discharge control method for controlling a flyback power supply circuit which includes a transformer having a primary coil and a secondary coil and performing voltage conversion, and a driver for controlling energization of the primary coil and which supplies electric energy to a plasma reactor which generates plasma by discharge,
the discharge control method comprising:
a measurement step of measuring primary current flowing through the primary coil and primary voltage generated in the primary coil;
an energy calculation step of calculating supply energy supplied to the primary coil in accordance with the following Equation (1) and regeneration energy which is a portion of the supply energy not used for the discharge in the plasma reactor in accordance with the following Equation (2):

$$E_{sup} = \int_{t_1}^{t_2} V_p \cdot I_p \, dt \qquad (1)$$

$$E_{reg} = \int_{t_3}^{t_5} V_p \cdot I_p \, dt \qquad (2)$$

wherein $E_{sup}$ represents the supply energy, $E_{reg}$ represents the regeneration energy, $I_p$ represents the value of the primary current, $V_p$ represents the value of the primary voltage, and wherein a first time period during which the supply energy is generated is denoted as a first period from time $t_1$ to time $t_2$ and a second time period during which the regeneration energy is generated is denoted as a second period from time $t_3$ to time $t_5$;
a comparing step of comparing the supply energy and the regeneration energy; and
a control step of controlling the power supply circuit based on a comparison of the supply energy and the regeneration energy in the comparing step.

* * * * *